US012628508B2

(12) United States Patent
Guo et al.

(10) Patent No.: US 12,628,508 B2
(45) Date of Patent: May 12, 2026

(54) DISPLAY SUBSTRATE, METHOD FOR MANUFACTURING SAME AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Yuanzheng Guo, Beijing (CN); Peng Huang, Beijing (CN); Tao Gao, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 772 days.

(21) Appl. No.: 17/913,807

(22) PCT Filed: Oct. 12, 2021

(86) PCT No.: PCT/CN2021/123304
§ 371 (c)(1),
(2) Date: Sep. 22, 2022

(87) PCT Pub. No.: WO2022/111087
PCT Pub. Date: Jun. 2, 2022

(65) Prior Publication Data
US 2024/0215334 A1     Jun. 27, 2024

(30) Foreign Application Priority Data
Nov. 27, 2020    (CN) .......................... 202011363144.5

(51) Int. Cl.
H10K 59/124      (2023.01)
G09G 3/3233      (2016.01)
H10K 102/00      (2023.01)

(52) U.S. Cl.
CPC ......... *H10K 59/124* (2023.02); *G09G 3/3233* (2013.01); *G09G 2300/0819* (2013.01);
(Continued)

(58) Field of Classification Search
None
See application file for complete search history.

(56) References Cited

U.S. PATENT DOCUMENTS

2018/0083076 A1    3/2018  Hanada
2019/0123069 A1    4/2019  Yang et al.
(Continued)

FOREIGN PATENT DOCUMENTS

CN        104752470 A      7/2015
CN        107452756 A      12/2017
(Continued)

OTHER PUBLICATIONS

CN202011363144.5 Notification to grant patent right for invention.

*Primary Examiner* — Nilufa Rahim
(74) *Attorney, Agent, or Firm* — IPro, PLLC

(57) ABSTRACT

Provided is a display substrate. The display substrate includes a base substrate which includes a first surface; a first transistor which includes a first active layer and a first gate insulative layer; a first insulative layer; and a second transistor which includes a second active layer and an orthographic projection of the second active layer on the first surface is staggered from an orthographic projection of the first active layer on the first surface.

18 Claims, 12 Drawing Sheets

(52) U.S. Cl.

CPC ................ *G09G 2300/0842* (2013.01); *H10K*
                                    *2102/311* (2023.02)

(56)                    References Cited

U.S. PATENT DOCUMENTS

| | | | |
|---|---|---|---|
| 2019/0267409 A1 | 8/2019 | Hu et al. | |
| 2019/0386040 A1 | 12/2019 | Wang et al. | |
| 2020/0161570 A1 | 5/2020 | Bai et al. | |
| 2020/0395426 A1* | 12/2020 | Han | H10K 59/1213 |
| 2021/0408190 A1 | 12/2021 | Yang | |
| 2022/0359637 A1* | 11/2022 | Zhao | H10D 86/411 |

FOREIGN PATENT DOCUMENTS

| | | | |
|---|---|---|---|
| CN | 107818991 A | 3/2018 | |
| CN | 107910335 A | 4/2018 | |
| CN | 108493198 A | 9/2018 | |
| CN | 109065583 A | 12/2018 | |
| CN | 210777794 U | 6/2020 | |
| CN | 111785759 A | 10/2020 | |
| CN | 112510069 A | 3/2021 | |
| JP | 2018049919 A | 3/2018 | |

* cited by examiner

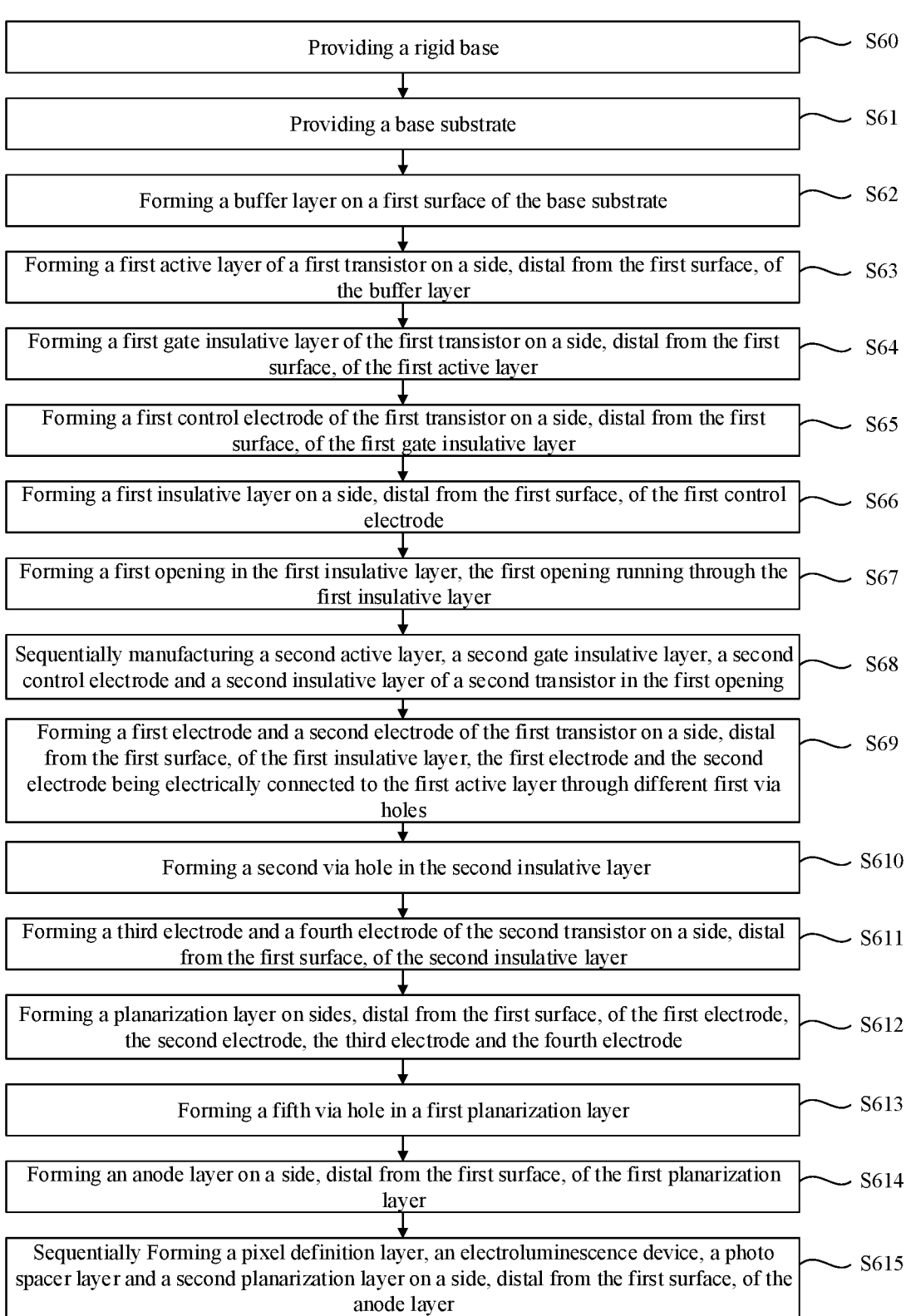

Providing a rigid base                                                                                    S60

Providing a base substrate                                                                                S61

Forming a buffer layer on a first surface of the base substrate                                            S62

Forming a first active layer of a first transistor on a side, distal from the first surface, of the buffer layer                                            S63

Forming a first gate insulative layer of the first transistor on a side, distal from the first surface, of the first active layer                                            S64

Forming a first control electrode of the first transistor on a side, distal from the first surface, of the first gate insulative layer                                            S65

Forming a first insulative layer on a side, distal from the first surface, of the first control electrode                                            S66

Forming a first opening in the first insulative layer, the first opening running through the first insulative layer                                            S67

Sequentially manufacturing a second active layer, a second gate insulative layer, a second control electrode and a second insulative layer of a second transistor in the first opening                                            S68

Forming a first electrode and a second electrode of the first transistor on a side, distal from the first surface, of the first insulative layer, the first electrode and the second electrode being electrically connected to the first active layer through different first via holes                                            S69

Forming a second via hole in the second insulative layer                                                   S610

Forming a third electrode and a fourth electrode of the second transistor on a side, distal from the first surface, of the second insulative layer                                            S611

Forming a planarization layer on sides, distal from the first surface, of the first electrode, the second electrode, the third electrode and the fourth electrode                                            S612

Forming a fifth via hole in a first planarization layer                                                   S613

Forming an anode layer on a side, distal from the first surface, of the first planarization layer                                            S614

Sequentially Forming a pixel definition layer, an electroluminescence device, a photo spacer layer and a second planarization layer on a side, distal from the first surface, of the anode layer                                            S615

DISPLAY SUBSTRATE, METHOD FOR MANUFACTURING SAME AND DISPLAY DEVICE

CROSS-REFERENCE TO RELATED APPLICATION

The present disclosure is a U.S. national stage of the international application No. PCT/CN2021/123304, filed on Oct. 12, 2021, which claims priority to Chinese Patent Application No. 202011363144.5, filed on Nov. 27, 2020 and entitled "DISPLAY SUBSTRATE AND MANUFACTURING METHOD THEREOF AND DISPLAY DEVICE." the disclosures of which are incorporated herein by reference in their entireties.

TECHNICAL FIELD

The present disclosure relates to the field of displays, and in particular relates to a display substrate, a method for manufacturing the same and a display device.

BACKGROUND

A flexible display panel, which has attracted more and more attention because of its foldability, includes a display substrate having a plurality of pixel regions arranged in an array, one organic light-emitting diode (OLED) and one pixel circuit are arranged in each pixel region, and the pixel circuit is configured to control the connected light-emitting diode to emit light.

SUMMARY

Embodiments of the present disclosure provide a display substrate, a method for manufacturing the same and a display device. The technical solutions are described as below.

According to some embodiments of the present disclosure, the present disclosure provides a display substrate. The display substrate includes:

a base substrate, including a first surface;

a first transistor, including a first active layer and a first gate insulative layer, the first active layer being disposed on the first surface of the base substrate, the first gate insulative layer being disposed on a side, distal from the first surface, of the first active layer, and covering the first active layer;

a first insulative layer, disposed on a side, distal from the first surface, of the first gate insulative layer and provided with a first opening running through the first insulative layer; and a second transistor, including a second active layer disposed in the first opening, an orthographic projection of the second active layer on the first surface being staggered from an orthographic projection of the first active layer on the first surface, the second active layer being made from an oxide semiconductor material.

In some embodiments of the present disclosure, a heat-resistant temperature of the first insulative layer is greater than 350° C.

In some embodiments of the present disclosure, the first insulative layer includes a photosensitive polyimide (PSPI) layer.

In some embodiments of the present disclosure, a thickness of the first insulative layer in a direction perpendicular to the first surface is less than or equal to 3 μm.

In some embodiments of the present disclosure, the first transistor further includes a first control electrode, a first electrode, and a second electrode; wherein the first control electrode is disposed on a side, distal from the first surface, of the first gate insulative layer; the first insulative layer covers the first control electrode; and the first electrode and the second electrode run through the first insulative layer and the first gate insulative layer, and are electrically connected to the first active layer; and the second transistor further includes a second gate insulative layer, a second control electrode, a second insulative layer, a third electrode, and a fourth electrode; wherein the second gate insulative layer and the second control electrode are sequentially stacked on the second active layer in a direction away from the first surface; the second insulative layer covers the second active layer, the second gate insulative layer and the second control electrode; the third electrode and the fourth electrode run through the second insulative layer; the third electrode is electrically connected to the second active electrode and the first control electrode; and the fourth electrode is electrically connected to the second active layer;

wherein the second gate insulative layer, the second control electrode, and the second insulative layer are all disposed in the first opening.

In some embodiments of the present disclosure, the first insulative layer and the first gate insulative layer are provided with first via holes, wherein the first electrode and the second electrode are electrically connected to the first active layer via the different first via holes.

In some embodiments of the present disclosure, the second insulative layer wraps the second active layer, the second gate insulative layer, and the second control electrode; the second insulative layer is provided with second via holes; and the third electrode and the fourth electrode are electrically connected to the second active layer via the different second via holes.

In some embodiments of the present disclosure, the display substrate further includes:

a planarization layer disposed on a side, distal from the first surface, of the first insulative layer and covering the first electrode, the second electrode, the third electrode, the fourth electrode, the second insulative layer, and the first insulative layer; and an anode layer disposed on a side, distal from the first surface, of the planarization layer and electrically connected to the second electrode;

wherein an orthographic projection of the anode layer on the first surface is staggered from the orthographic projection of the second active layer on the first surface.

In some embodiments of the present disclosure, the orthographic projection of the first active layer on the first surface is within the orthographic projection of the anode layer on the first surface.

In some embodiments of the present disclosure, the planarization layer is an organic layer.

In some embodiments of the present disclosure, the first active layer is a low-temperature polysilicon (LTPS) layer.

In some embodiments of the present disclosure, the second active layer is an indium gallium zinc oxide (IGZO) semiconductor layer.

In some embodiments of the present disclosure, the base substrate is a polyimide (PI) substrate.

According to some embodiments of the present disclosure, the present disclosure provides a method for manufacturing a display substrate. The method includes:

providing a base substrate having a first surface;

forming a first active layer of a first transistor on a first surface of the base substrate;

forming a first gate insulative layer of the first transistor on a side, distal from the first surface, of the first active layer, the first gate insulative layer covering the first active layer;

forming a first insulative layer on a side, distal from the first surface, of the first gate insulative layer, the first insulative layer being provided with a first opening running through the first insulative layer; and forming a second active layer of a second transistor in the first opening, the second active layer being made from an oxide semiconductor material, an orthographic projection of the second active layer on the first surface being staggered from an orthographic projection of the first active layer on the first surface.

In some embodiments of the present disclosure, the method further includes:

forming a third via hole in the first insulative layer to expose the first gate insulative layer;

forming a fourth via hole in an exposed portion of the first gate insulative layer to expose the first active layer, the fourth via hole being communicated with the third via hole to form a first via hole; and forming a first electrode and a second electrode of the first transistor on a side, distal from the first surface, of the first insulative layer, the first electrode and the second electrode being electrically connected to the first active layer via the different first via holes.

According to some embodiments of the present disclosure, the present disclosure provides a display device. The display device includes the display substrate according to any one of the above aspects.

BRIEF DESCRIPTION OF THE DRAWINGS

For clearer descriptions of the technical solutions in the embodiments of the present disclosure, the following briefly introduces the accompanying drawings required for describing the embodiments. Apparently, the accompanying drawings in the following description illustrate merely some embodiments of the present disclosure, and persons of ordinary skill in the art still derive other drawings from these accompanying drawings without creative efforts.

FIG. 8 is a flowchart of a method for manufacturing a display substrate according to some embodiments of the present disclosure;

DETAILED DESCRIPTION

For clearer descriptions of the objectives, technical solutions, and advantages of the present disclosure, embodiments of the present disclosure are described in detail hereinafter with reference to the accompanying drawings.

The pixel circuit includes a first transistor and a second transistor. An active layer of the first transistor and an active layer of the second transistor are made of different materials, and hence formed separately. In the pixel circuit known to the inventors, at least two inorganic insulative layers are arranged between the active layer of the first transistor and the active layer of the second transistor. The inorganic insulative layer may not be bent easily, resulting in poor bending performance of a flexible display panel.

Figure 1:
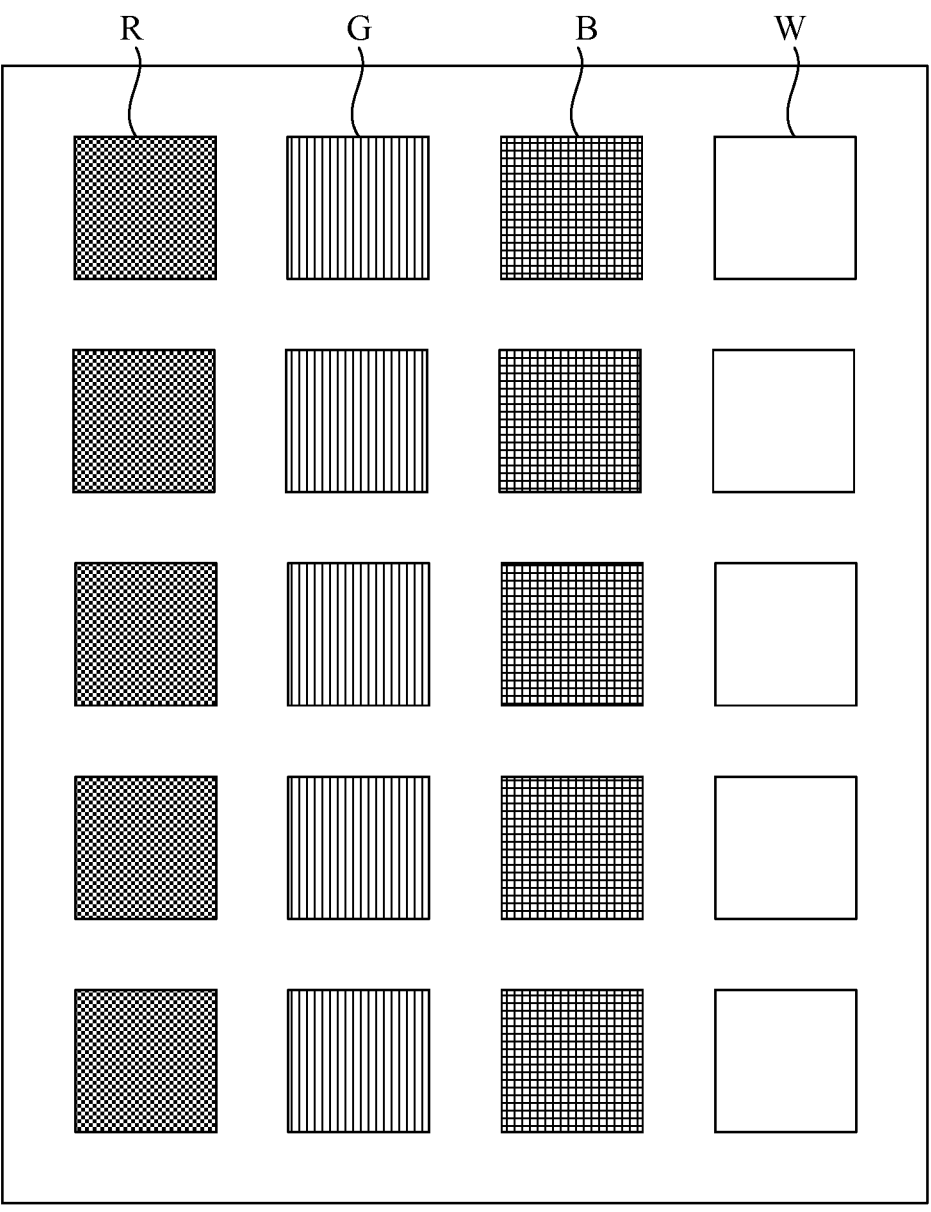
FIG. 1 is a top view of a display substrate according to some embodiments of the present disclosure.

FIG. 1 is a top view of a display substrate according to some embodiments of the present disclosure. Referring to FIG. 1 the display substrate includes a plurality of pixel regions arranged in an array. The pixel region includes a red pixel region (R), a green pixel region (G), a blue pixel region (B) and a white pixel region (W). In other implementations, the pixel region does not include the white pixel region (W).

In some embodiments of the present disclosure, an OLED pixel circuit includes an LTPS thin film transistor (TFT) and an oxide TFT. In the pixel circuit, drive transistors are mostly LTPS TFTs, and transistors electrically connected to control electrodes of the drive transistors are oxide TFTs, so as to reduce the impacts caused by leakage current of the transistors to potentials of the control electrodes of the drive transistors. For example, in a 2T1C pixel circuit illustrated in FIG. 2, a drive transistor T1 is an LTPS TFT, and a switch transistor T2 is an oxide TFT. For example, in a 7T1C pixel circuit illustrated in FIG. 3, a drive transistor T5 is an LTPS TFT, and a first reset transistor T3 and a compensation transistor T4 electrically connected to a control electrode of the drive transistor T5 are oxide TFTs. In addition to the first reset transistor T3, the compensation transistor T4, and the drive transistor T5, other transistors in FIG. 3 are, but are not limited to, LTPS transistors.

Figure 2:
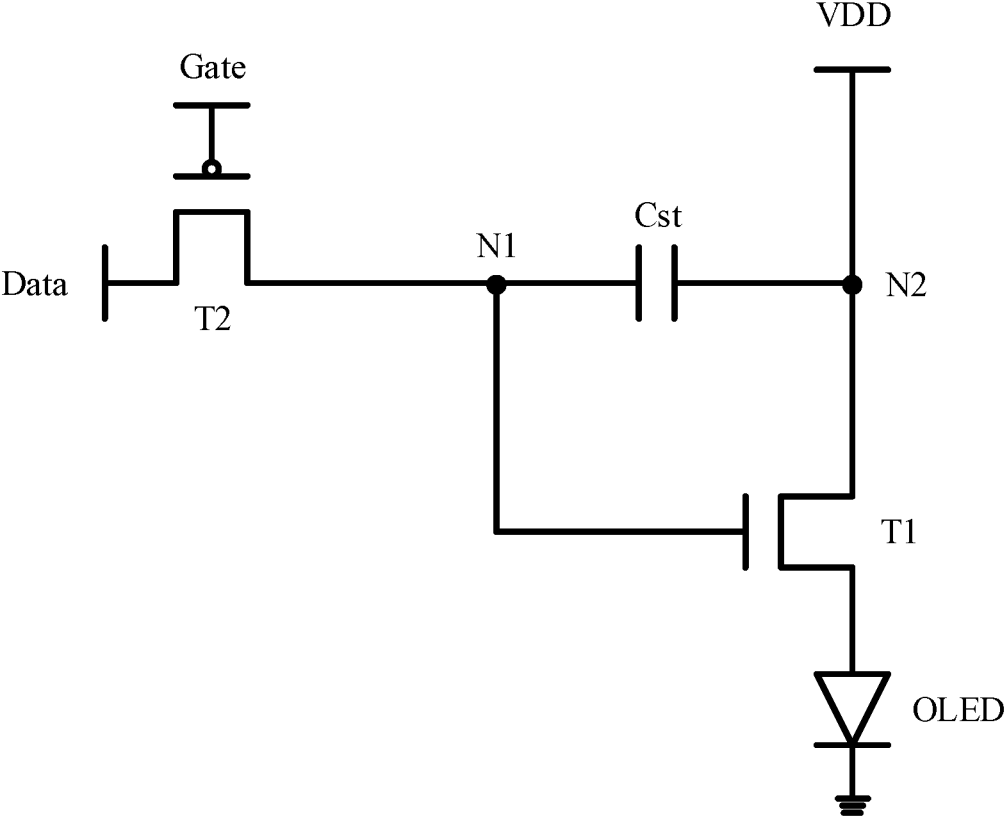
FIG. 2 is a circuit diagram of a 2T1C pixel circuit according to some embodiments of the present disclosure.
Figure 3:
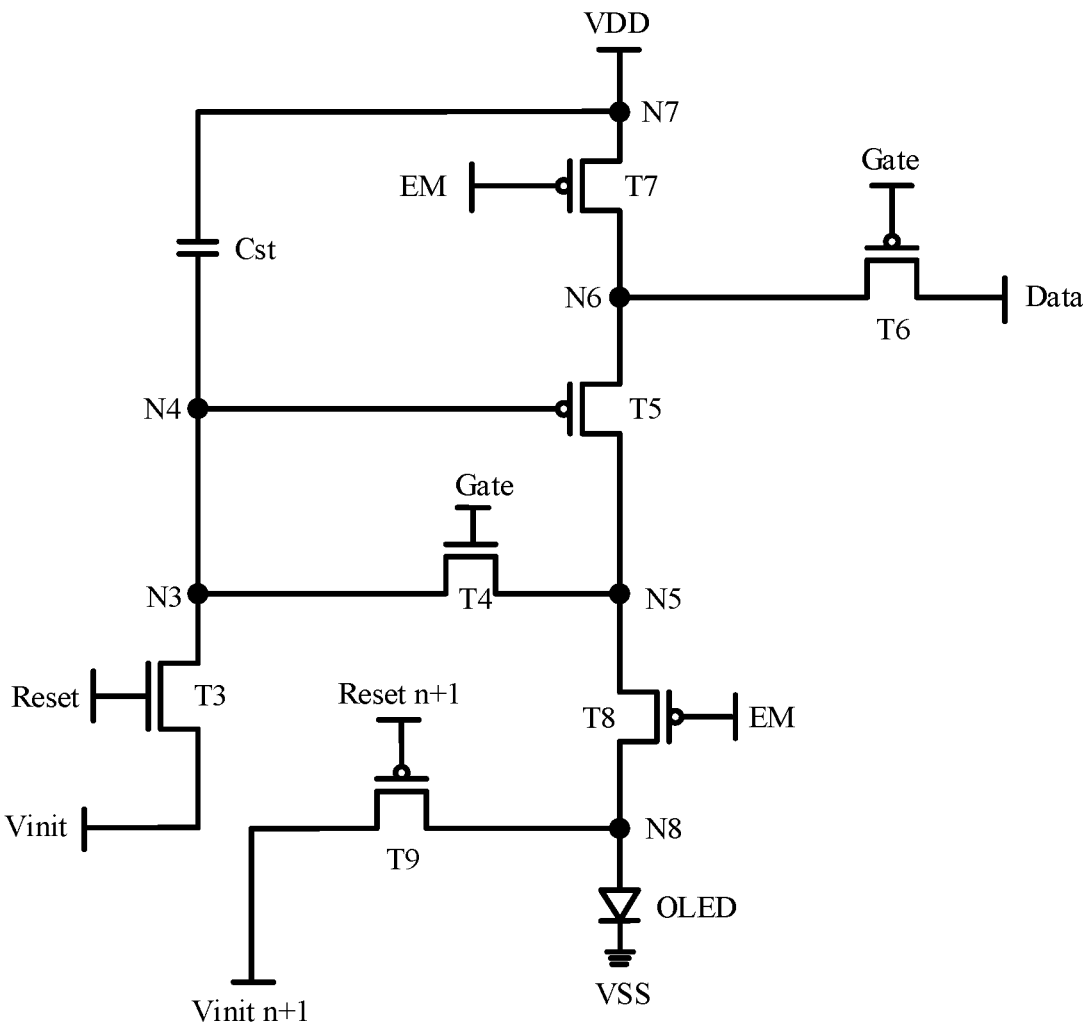
FIG. 3 is a circuit diagram of a 7T1C pixel circuit according to some embodiments of the present disclosure.

FIG. 2 is a circuit diagram of a 2T1C pixel circuit according to some embodiments of the present disclosure. Referring to FIG. 2, VDD is a first voltage signal terminal, Data is a data signal terminal, and Gate is a scan signal terminal. A first electrode of the drive transistor T1 is electrically connected to one polar plate of a capacitor Cst and the first voltage signal terminal by a second node N2, and a second electrode of the drive transistor T1 is electrically connected to an OLED. A first electrode of the switch transistor T2 is electrically connected to the data signal terminal, a second electrode of the switch transistor T2 is electrically connected to a control electrode of the drive transistor T1 and the other polar plate of the capacitor Cst by a first node N1, and a control electrode of the switch transistor T2 is electrically connected to the scan signal terminal (Gate). In a data writing phase, the scan signal terminal supplies a scan signal to the control electrode of the switch transistor T2, so as to turn on the switch transistor T2, and the data signal terminal supplies a data voltage to the first node N1 by the switch transistor T2. In a light-emitting phase, the switch transistor T2 is turned off, and the drive transistor T1 is turned on under the action of the data voltage. The voltage supplied by the first voltage signal terminal travels through the drive transistor T1 to drive the OLED to emit light.

Both the drive transistor T1 and the switch transistor T2 are TFTs, the control electrode is a gate electrode of the TFT, the first electrode is one of a source electrode and a drain electrode of the TFT, and the second electrode is the other of the source electrode and the drain electrode of the TFT.

It is noted that FIG. 2 illustrates a circuit diagram of a 2T1C (two transistors and one capacitor) pixel circuit. In the 2T1C pixel circuit, the drive transistor T1 is the LTPS TFT, and the switch transistor T2 is the oxide TFT, i.e., a first transistor is the drive transistor T1, and a second transistor is the switch transistor T2. This circuit is merely an example, and the circuit in the display substrate is in other forms in other implementations. For example, a reference is made to FIG. 3 for a specific circuit diagram of a 7T1C circuit.

FIG. 3 is a circuit diagram of a 7T1C pixel circuit according to some embodiments of the present disclosure. Referring to FIG. 3, reset is a reset signal terminal, EM is an electroluminescence control signal terminal; Vinit is an initialization voltage terminal; VSS is a second voltage signal terminal; the first voltage signal terminal VDD is configured to supply a first voltage signal; the second voltage signal terminal VSS is configured to supply a second voltage signal; and the first voltage signal is a high-level signal relative to the second voltage signal. T3 is a first reset transistor, T4 is a compensation transistor, T5 is a drive transistor, T6 is a switch transistor, T7 is a first electroluminescence control transistor, T8 is a second electroluminescence control transistor, and T9 is a second reset transistor. A control electrode of the first reset transistor T3 is electrically connected to the reset signal terminal, a first electrode of the first reset transistor T3 is electrically connected to the initialization voltage terminal, and a second electrode of the first reset transistor T3 is electrically connected to a second electrode of the compensation transistor T4 by a third node N3, to a control electrode of the drive transistor T5 by a fourth node N4, and also to one polar plate of the capacitor Cst. A control electrode of the compensation transistor T4 is electrically connected to the scan signal terminal, and a first electrode of the compensation transistor T4 is electrically connected to a second electrode of the drive transistor T5 and a first electrode of the second electroluminescence control transistor T8 by a fifth node N5. A second electrode of the switch transistor T6 is electrically connected to a first electrode of the drive transistor T5 and a second electrode of the first electroluminescence control transistor T7 by a sixth node N6, a first electrode of the switch transistor T6 is electrically connected to a data input terminal, and a control electrode of the switch transistor T6 is electrically connected to the scan signal terminal. A first electrode of the first electroluminescence control transistor T7 is electrically connected to the other polar plate of the capacitor Cst by a seventh node N7 and also to the first voltage signal terminal, and a control electrode of the first electroluminescence control transistor T7 is electrically connected to the electroluminescence control signal terminal. A control electrode of the second electroluminescence control transistor T8 is electrically connected to the electroluminescence control signal terminal, and a second electrode of the second electroluminescence control transistor T8 is electrically connected to the second electrode of the second reset transistor T9 by an eighth node N8 and also to one terminal of the OLED. The other terminal of the OLED is electrically connected to the second voltage signal terminal. A first electrode of the second reset transistor T9 is electrically connected to another initialization voltage terminal (Vinit n+1), and a control electrode of the second reset transistor T9 is electrically connected to another reset signal terminal (Reset n+1).

The above-mentioned transistors are all TFTs, the control electrode is the gate of the TFT, the first electrode is one of the source electrode and the drain electrode of the TFT, and the second electrode is the other of the source electrode and the drain electrode of the TFT.

In the 7T1C pixel circuit illustrated in FIG. 3, the drive transistor T5 is the LTPS TFT, and the first reset transistor T3 and the compensation transistor T4 are the oxide TFTs, i.e., a first transistor is the drive transistor T5, and a second transistor is the first reset transistor T3 or the compensation transistor T4. The second electroluminescence control transistor T8 is also the LTPS TFT, in this case, the first transistor is the second electroluminescence control transistor T8, and the second transistor is the compensation transistor T4.

Figure 4:
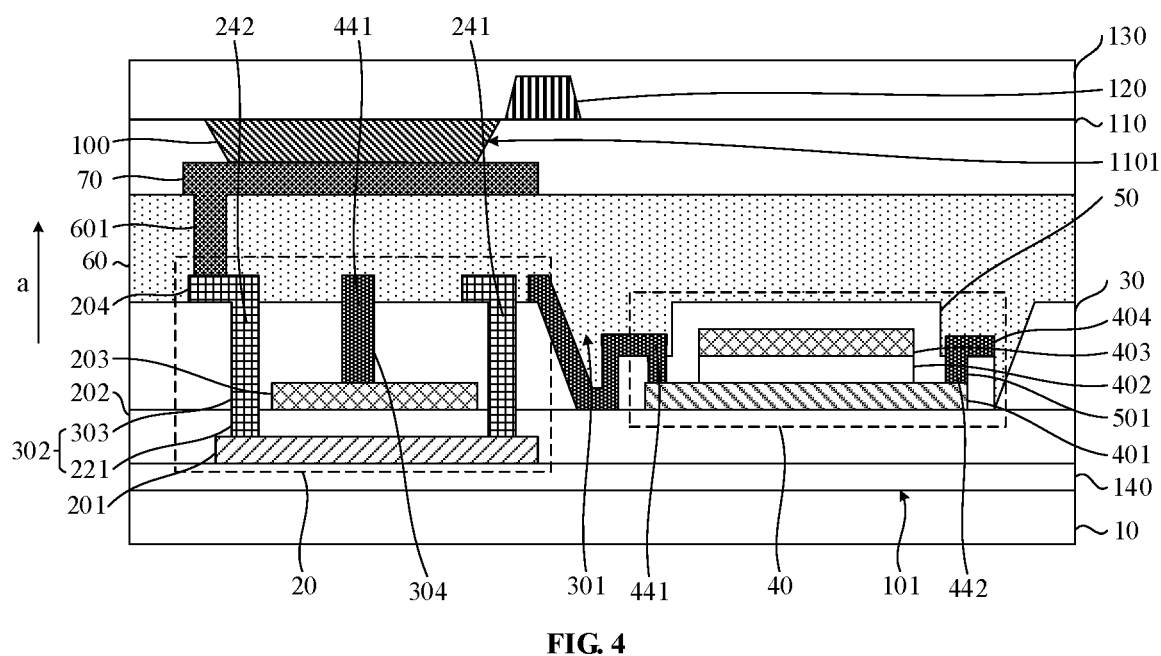
FIG. 4 is a schematic diagram of a connection mode of a first transistor and a second transistor according to some embodiments of the present disclosure.

FIG. 4 is a schematic diagram of a connection mode of a first transistor and a second transistor according to some embodiments of the present disclosure. Referring to FIG. 4 A display substrate includes a base substrate 10, a first transistor 20, a second transistor 40, and a first insulative layer 30. The base substrate 10 includes a first surface 101. The first transistor 20 includes a first active layer 201 and a first gate insulating (GI) layer 202. The second transistor 40 includes a second active layer 401. The first active layer 201 is disposed on the first surface 101 of the base substrate 10, and the first gate insulative layer 202 is disposed on a side, distal from the first surface 101, of the first active layer 201 and covers the first active layer 201. The first insulative layer 30 is disposed on aside, distal from the first surface 101, of the first gate insulative layer 202. The first insulative layer 30 is provided with a first opening 301 running through the first insulative layer 30, and the second active layer 401 is disposed on the first gate insulative layer 202 in the first opening 301. The second active layer 401 is made from an oxide semiconductor material, and an orthographic projection of the first active layer 201 on the first surface 101 is staggered from an orthographic projection of the second active layer 401 on the first surface 101.

In some embodiments of the present disclosure, the first transistor is fabricated on the base substrate, and the first insulative layer is arranged on the first transistor, i.e., the first active layer and the first gate insulative layer of the first transistor are disposed under the first insulative layer. The first insulative layer is provided with the first opening in which the second active layer of the second transistor is disposed. Meanwhile, the second active layer is disposed on the first gate insulative layer, i.e., the first active layer and the second active layer are spaced from each other by only one first gate insulative layer. The insulative layers spaced between the first active layer and the second active layer are reduced and thus the first active layer and the second active layer are more easily bendable, such that the bending performance of a flexible display panel is improved.

In some embodiments of the present disclosure, the first active layer 201 is a channel region of the first transistor 20, and the second active layer 401 is a channel region of the second transistor 40.

In some embodiments of the present disclosure, the ortho-graphic projection of the first active layer 201 on the first surface 101 is staggered from the orthographic projection of the second active layer 401 on the first surface 101, indicating that the orthographic projection of the first active layer 201 on the first surface 101 is not overlapped with the orthographic projection of the second active layer 401 on the first surface 101.

In some embodiment of the present disclosure, the OLED is a current-driven device, and the drive transistor plays the role of supplying current to the OLED to enable the OLED to emit light. The magnitude of driving current travelling through the drive transistor is associated with a threshold voltage of the drive transistor, and the threshold voltage of the drive transistor is associated with the material of an active layer of the drive transistor. In order to ensure the stability of the threshold voltage of the drive transistor, the active layer is usually made from a polysilicon material.

A transistor electrically connected to a gate of the drive transistor mainly serves the function of controlling the data signal to be written into the capacitor, thereby controlling on/off of the drive transistor. In order to ensure the accuracy in controlling on/off of the drive transistor, it is necessary to ensure low leakage current of the transistor electrically connected to the gate of the drive transistor. Since the leakage current of the transistor is also associated with the material of the active layer of the transistor, the active layer is made from the oxide semiconductor material to ensure the low leakage current of the transistor.

That is, the first active layer 201 is made from the polysilicon material (Poly-Si, P-si), the second active layer 401 is made from the oxide semiconductor material, and the second transistor 40 is called the oxide TFT.

Exemplarily, the first active layer 201 is an LTPS layer. The LTPS has a high electron movement speed, which improves the reaction speed of the drive transistor, thereby improving the display effect of a display device.

Exemplarily, the second active layer 401 is an IGZO semiconductor layer. The IGZO has a high mobility, which significantly reduces the leakage current.

In some embodiments of the present disclosure, the first insulative layer 30 is an organic layer.

The organic layer with good bending performance bends more easily, and therefore, providing the first insulative layer 30 as the organic layer is more conducive to bending of the display substrate.

In some embodiments of the present disclosure, a heat-resistant temperature of the first insulative layer 30 is greater than 350 degrees Celsius (° C.).

As the second active layer 401 is disposed in the first opening 301 of the first insulative layer 30, and the second active layer 401 needs to be subjected to a high-temperature annealing treatment during the manufacturing process, the heat-resistant temperature of the first insulative layer 30 is limited to ensure that the performance of the first insulative layer 30 is changed due to the high temperature during the high-temperature annealing process.

In some embodiments of the present disclosure, the heat-resistance temperature of the first insulative layer 30 is greater than 350° C., which means that the first insulative layer 30 lasts for 60 minutes in an environment of 350° C., with the thermal weight loss rate of the first insulative layer 30 being less than 1%. In the case that the first insulative layer 30 is etched, a via hole with a diameter of less than 4 μm is formed in the first insulative layer 30. An elongation at break of the first insulative layer 30 is greater than 10%, and a coefficient of thermal expansion (CTE) of the first insulative layer 30 is less than 40 ppm/° C. (the change of the CTE is less than 40 parts per million for every 1° C. change in temperature). Since the first electrode, the second electrode, the third electrode and the fourth electrode need to be manufactured on the first insulative layer 30, and film layers where the first electrode and the second electrode are disposed, as well as film layers where the third electrode and the fourth electrode are disposed need to be developed and etched, it is necessary to ensure that the first insulative layer 30 withstands corrosion by an organic solvent such as a stripping solution, a developing solution or an etching solution after being cured, such that the corrosion resistance of the first insulative layer 30 is ensured.

Exemplarily, the first insulative layer 30 includes a pho-tosensitive polyimide (PSPI) layer.

Referring to FIG. 4 again, the first transistor 20 further includes a first control electrode 203, a first electrode 241, and a second electrode 242; and the second transistor 40 further includes a second gate insulative layer 402, a second control electrode 403, a second insulative layer 50, a third electrode 441, and a fourth electrode 442. The first electrode 241 and the second electrode 242 are disposed in a first source/drain (SD) metal layer 204, and the third electrode 441 and the fourth electrode 442 are disposed in a second source/drain metal layer 404.

The first control electrode 203 is disposed on a side, distal from the first surface 101, of the first gate insulative layer 202, the first insulative layer 30 covers the first control electrode 203, the first electrode 241 and the second elec-trode 242 run through the first insulative layer 30 and the first gate insulative layer 202, and both the first electrode 241 and the second electrode 242 are electrically connected to the first active layer 201. The second gate insulative layer 402 is disposed on a side, distal from the first surface 101, of the second active layer 401, and the second control electrode 403 is disposed on a side, distal from the first surface 101, of the second gate insulative layer 402. The second insulative layer 50 is disposed on a side, distal from the first surface 101, of the second active layer 401, and covers the second active layer 401, the second gate insulative layer 402 and the second control electrode 403. The third electrode 441 and the fourth electrode 442 run through the second insulative layer 50, the third electrode 441 is electrically connected to the second active layer 401 and the first control electrode 203, and the fourth electrode 442 is electrically connected to the second active layer 401.

The first gate insulative layer 202 is disposed between the first active layer 201 and the first control electrode 203, and the first active layer 201 and the first control electrode 203 are separated by the first gate insulative layer 202.

Similarly, the second active layer 401 and the second control electrode 403 are separated from each other by the second gate insulative layer 402.

Exemplarily, the first gate insulative layer 202 is a silicon oxide (SiOx) layer.

Exemplarily, the second gate insulative layer 402 is a silicon oxide layer or a silicon nitride (SiNx) layer.

The first insulative layer 30 is disposed between the first control electrode 203 and the first source/drain metal layer 204.

Similarly, the second insulative layer 50 is disposed between the second control electrode 403 and the second source/drain metal layer 404.

Exemplarily, the first control electrode 203 is made from a metal, indium tin oxide (ITO) or the like, and the second control electrode 403 is made from a metal, ITO or the like. The first control electrode 203 and the second control electrode 403 is made from the same or different materials.

It needs to be noted that the first source/drain metal layer 204 and the second source/drain metal layer 404 are only used as names, and do not mean that the first source/drain metal layer 204 and the second source/drain metal layer 404 are only made from metals, for example, they are also made from metal oxides.

Exemplarily, the first electrode 241 and the second electrode 242 are made from metals, ITO or the like, and the third electrode 441 and the fourth electrode 442 are made from metals, ITO or the like. The first electrode 241 and the second electrode 242, as well as the third electrode 441 and the fourth electrode 442, are made from the same or different materials.

Exemplarily, the second insulative layer 50 is an inorganic insulative layer, for example, a silicon nitride insulative layer, or an organic insulative layer, for example, an epoxy resin insulative layer. Owing to good insulativity of the silicon nitride and the epoxy resin, the insulativity of the second insulative layer 50 is ensured.

In some embodiments of the present disclosure, the first control electrode 203 is a gate electrode of the first transistor 20, the first electrode 241 is one of a source electrode and a drain electrode of the first transistor 20, and the second electrode 242 is the other of the source electrode and the drain electrode of the first transistor 20. The second control electrode 403 is a gate electrode of the second transistor 40, the third electrode 441 is one of a source electrode and a drain electrode of the second transistor 40, and the fourth electrode 442 is the other of the source electrode and the drain electrode of the second transistor 40.

FIG. 4 is a sectional view, in which the third electrode 441 connected to the first control electrode 203 is not fully illustrated. In fact, two portions of the third electrode 441 in FIG. 4 are connected by a connecting portion 443 (see FIG. 5). The top view of FIG. 5 only illustrates a top-view positional relationship between the source/drain metal layer and the first control electrode.

Figure 5:
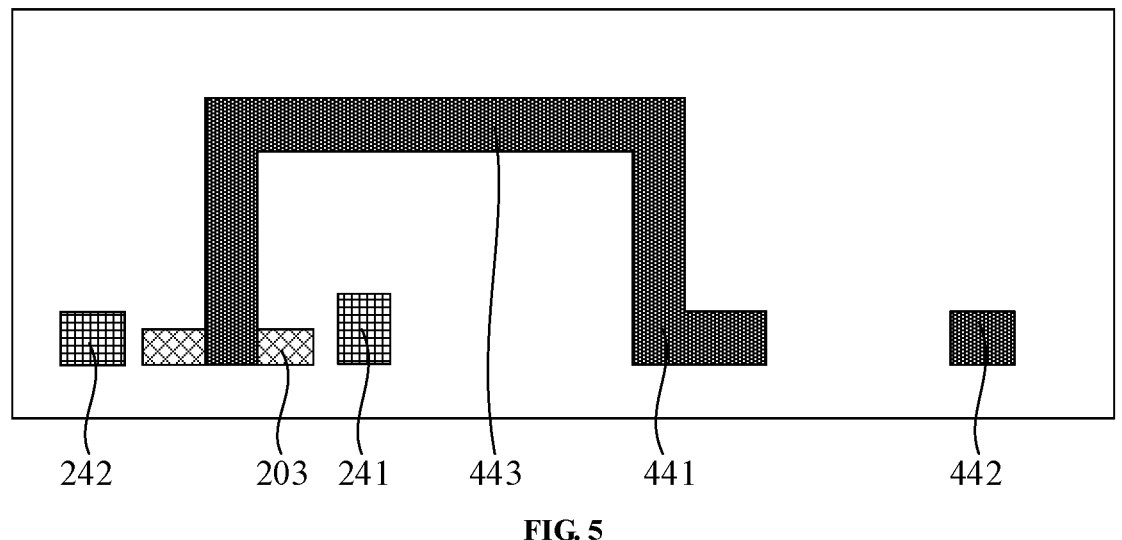
FIG. 5 is a top view of a positional relationship between a source/drain metal layer and a first control electrode in FIG. 4.

FIG. 5 is a top view of the positional relationship between the source/drain metal layer and the first control electrode in FIG. 4. Referring to FIG. 5, the connecting portion 443 of the third electrode 441 bypasses the first electrode 241 to be connected to the first control electrode 203.

The structures of the first transistor 20 and the second transistor 40 illustrated in FIG. 4 are merely examples. In other implementations, the first transistor 20 and the second transistor 40 are other structures, for example, the first transistor 20 and the second transistor 40 are transistors of bottom-gate structures or transistors of double-gate structures.

In a connection mode of the first transistor and the second transistor illustrated in FIG. 4, the first transistor 20 is the drive transistor T1 in FIG. 2, and the second transistor 40 is the switch transistor T2 in FIG. 2; alternatively, the first transistor 20 is the drive transistor T5 in FIG. 3, and the second transistor 40 is the first reset transistor T3 or the compensation transistor T4 in FIG. 3. In the case that the first transistor 20 is the second electroluminescence control transistor T8 in FIG. 3, and the second transistor 40 is the compensation transistor T4 in FIG. 3, reference is made to FIG. 6 for a connection mode of the first transistor and the second transistor.

Figure 6:
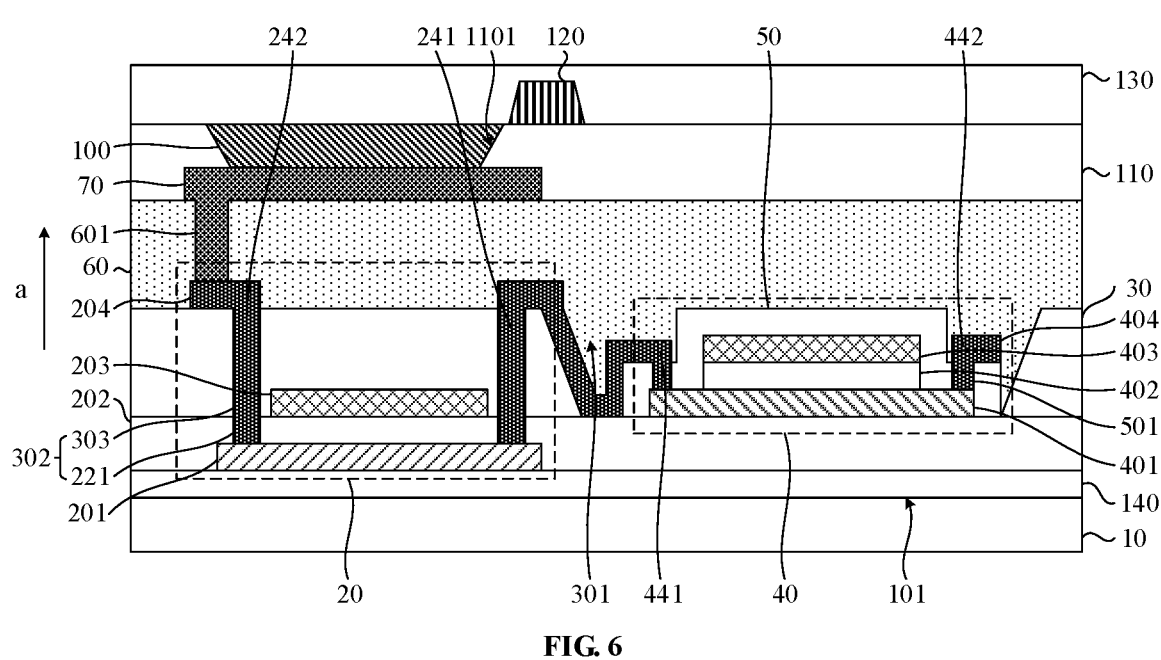
FIG. 6 is a schematic diagram of another connection mode of a first transistor and a second transistor according to some embodiments of the present disclosure.

FIG. 6 is a schematic diagram of another connection mode of a first transistor and a second transistor according to embodiment of the present disclosure. Referring to FIG. 6, the second transistor 40 is an oxide thin film transistor, and the first transistor 20 is an LTPS transistor but not a drive transistor at this time. For example, the second transistor 40 is the compensation transistor T4 in the 7T1C pixel circuit of FIG. 3, and the first transistor 20 is the second electroluminescence control transistor T8 in the 7T1C pixel circuit of FIG. 3. At this time, the third electrode 441 of the second transistor 40 is electrically connected to the first electrode 241 of the first transistor 20.

In some embodiments of the present disclosure, the connection modes of the 2T1C and 7T1C pixel circuits described above are merely examples, and the actual connection modes are not limited thereto.

In some embodiments of the present disclosure, the second gate insulative layer 402, the second control electrode 403 and the second insulative layer 50 are all disposed in the first opening 301.

Since the first insulative layer 30 is the organic layer, and the organic layer is thick, i.e., the first opening 301 is deep, the second gate insulative layer 402, the second control electrode 403, and the second insulative layer 50 are all arranged in the first opening 301.

In some embodiments of the present disclosure, the base substrate 10 is a polyimide (PI) substrate. Polyimide bends easily to ensure the bending performance of the display substrate.

In some embodiments of the present disclosure, a thickness of the first insulative layer 30 in a direction a perpendicular to the first surface 101 is less than or equal to 3 μm.

Referring to FIGS. 4 and 6 again, the first insulative layer 30 and the first gate insulative layer 202 are provided with first via holes 302 therein, and the first electrode 241 and the second electrode 242 are electrically connected to the first active layer 201 via the different first via holes 302.

As illustrated in FIGS. 4 and 6, the first insulative layer 30 is provided with a third via hole 303, the first gate insulative layer 202 is provided with a fourth via hole 221, and the third via hole 303 and the fourth via hole 221 are communicated to form a first via hole 302.

As illustrated in FIGS. 4 and 6, the second insulative layer 50 wraps the second active layer 401, the second gate insulative layer 402 and the second control electrode 403, i.e., the second insulative layer 50 wraps all surfaces and sides of the second active layer 401, the second gate insulative layer 402 and the second control electrode 403, so as to prevent the second active layer 401, the second gate insulative layer 402 and the second control electrode 403 from being affected during subsequent etching of the film layers where the third electrode 441 and the fourth electrode 442 are disposed.

Similarly, the second insulative layer 50 is provided with a second via hole 501, and the third electrode 441 and the fourth electrode 442 are electrically connected to the second active layer 401 via the different second via holes 501.

As illustrated in FIG. 4, the first insulative layer 30 is provided with a fifth via hole 304 via which the third electrode 441 is electrically connected to the first control electrode 203.

In some embodiments of the present disclosure, the first insulative layer 30 and the first gate insulative layer 202 are provided with a plurality of first via holes 302, and one first transistor includes two first via holes 302. The second insulative layer 50 is provided with a plurality of second via holes 501, and one second transistor includes two second via holes 501.

Referring to FIGS. 4 and 6 again, the display substrate further includes a planarization (PLN) layer 60 and an anode layer 70. The planarization layer 60 is disposed on a side, distal from the first surface 101, of the first insulative layer 30, and covers the first electrode 241, the second electrode 242, the third electrode 441, the fourth electrode 442, the first insulative layer 30, and the second insulative layer 50. The anode layer 70 is disposed on a side, distal from the first surface 101, of the planarization layer 60, and is electrically connected to the second electrode 242.

In some embodiments of the present disclosure, the planarization layer 60 makes a surface of the display substrate on which the source/drain metal layer is formed more flat, such that film layers are better manufactured subsequently, and at the same time, the flatness of the finally fabricated display panel is ensured.

In an implementation of the embodiments of the present disclosure, the planarization layer 60 is the organic layer. With the organic layer having good bending performance, the display substrate is bent more easily.

Exemplarily, the planarization layer 60 is a resin layer since resin having insulativity and good bending performance.

In some embodiments of the present disclosure, the first transistor 20 and the second transistor 40 are wrapped by the base substrate 10 and the planarization layer 60, both which are made from organic materials, such that the first transistor 20 and the second transistor 40 bend more easily.

In some embodiments of the present disclosure, the anode layer 70 is a metal layer, such that the stability of signal transmission is ensured by using the metal layer as the anode layer 70.

As illustrated in FIGS. 4 and 6, the planarization layer 60 is provided with a sixth via hole 601 via which the anode layer 70 is electrically connected to the second electrode 242.

In an implementation of the embodiments of the present disclosure, an orthographic projection of the first active layer 201 on the first surface 101 is within an orthographic projection of the anode layer 70 on the first surface 101. The first transistor 20 is manufactured under the anode layer 70, and the first transistor is covered by the anode layer 70 to increase an aperture ratio of the display substrate.

In an implementation of the embodiments of the present disclosure, the orthographic projection of the anode layer 70 on the first surface 101 is staggered from the orthographic projection of the second active layer 401 on the first surface 101.

The second active layer 401 is an oxide semiconductor layer, and an oxide semiconductor material is sensitive to light, such that second stability is affected under light. The orthographic projection of the anode layer 70 on the first surface 101 is staggered from the orthographic projection of the second active layer 401 on the first surface 101, i.e., the second active layer 401 is far from the anode layer 70. Since the anode layer 70 is provided with an electroluminescence (EL) device 100, although the anode layer 70 is a metal layer and is capable of shielding light, the anode layer 70 under the electroluminescence device 100 may not completely shield the light of the electroluminescence device. For example, the light emitted by the electroluminescence device 100 is irradiated to one side of the base substrate through a gap in a side edge of the anode layer 70, however, since the second active layer 401 is far from the anode layer 70, less light is irradiated onto the second active layer 401 by the electroluminescence device 100, and even the light does not reach the second active layer 401, thereby reducing the impacts caused by the light emitted by the electroluminescence device to the second active layer 401.

In other practices, the second active layer 401 and the first active layer 201 are spaced from each other by at least two insulative layers, and the second active layer 401 is disposed on the insulative layer, such that the second active layer 401 is closer to the anode layer 70 in the direction a perpendicular to the first surface 101. In some embodiments of the present disclosure, the second active layer 401 is disposed in the first opening 301 of the first insulative layer 30, and therefore, compared with the other practices, the second active layer 401 in the embodiments of the present disclosure is also far from the anode layer 70 in the direction a perpendicular to the first surface 101, which reduces the impacts caused by light to the second active layer 401.

As illustrated in FIGS. 4 and 6, the display substrate further includes a pixel definition layer (PDL) 110 disposed on a side, distal from the first surface 101, of the anode layer 70. The pixel definition layer 110 is provided with a second opening 1101 running through the pixel definition layer 110. The electroluminescence device 100 is arranged in the second opening 1101 and electrically connected to the anode layer 70.

In some embodiments of the present disclosure, the electroluminescence device 100 includes a hole transport layer, an organic light-emitting layer, an electron transport layer, and a cathode layer that are sequentially stacked on the anode layer 70. The electron transport layer, the organic light-emitting layer, and the hole transport layer are arranged in the second opening 1101 of the pixel definition layer 110, and the cathode layer overlies the pixel definition layer 110.

In some embodiments, as illustrated in FIGS. 4 and 6, a photo spacer (PS) layer 120 is arranged on the pixel definition layer 110, and the photo spacer layer 120 is configured to support a mask plate in the case that the organic light-emitting layer is evaporated.

In some embodiments, as illustrated in FIGS. 4 and 6, the display substrate further includes a packaging layer 130.

In some embodiments, as illustrated in FIGS. 4 and 6, the display substrate further includes a buffer layer 140 disposed between the base substrate 10 and the first active layer 201 in the direction a perpendicular to the first surface 101. The first active layer 201 needs to be subjected to high-temperature annealing treatment in the fabricating process, and the buffer layer 140 is disposed on the base substrate 10 to prevent the base substrate 10 from being affected during the high-temperature annealing treatment.

The buffer layer 140 constitutes a buffer layer between the first active layer 201 and the base substrate 10, while the buffer layer 140 and the first gate insulative layer 202 together constitute a buffer layer between the second active layer 401 and the base substrate 10.

Exemplarily, the buffer layer 140 is a silicon oxide layer, a silicon nitride layer or a silicon oxynitride layer, or a laminate of any two or three layers of the silicon oxide layer, the silicon nitride layer, and the silicon oxynitride layer.

In some embodiments of the present disclosure, the first active layer 201 is subjected to high-temperature annealing at a temperature of 400° C. to 450° C. after the first gate insulative layer 202 is formed and before the first control electrode 203 is formed. The second active layer 401 is subjected to high-temperature annealing at a temperature of 320° C. to 350° C. after the second insulative layer 50 is formed and before the first electrode 241 and the second electrode 242 are formed.

Figure 7:
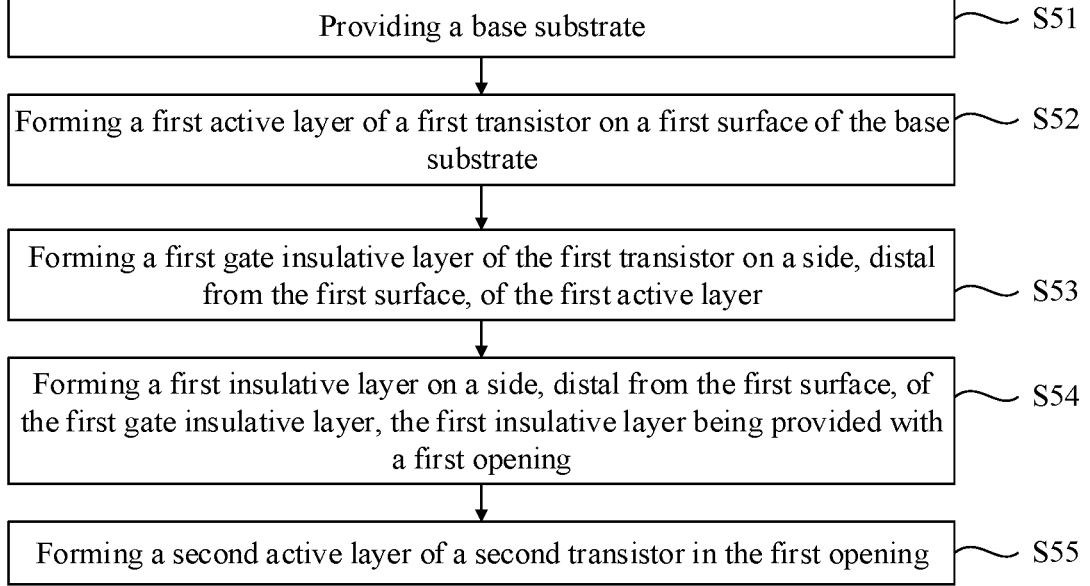
FIG. 7 is a flowchart of a method for manufacturing a display substrate according to some embodiments of the present disclosure.

FIG. 7 is a flowchart of a method for manufacturing a display substrate according to an embodiment of the present disclosure. Referring to FIG. 7, the method includes the following steps.

In S51, a base substrate is provided, wherein the base substrate is provided with a first surface.

In S52, a first active layer of a first transistor is formed on the first surface of the base substrate.

Exemplarily, the first active layer is made from a poly-silicon material.

Exemplarily, the first active layer is formed by deposition.

In S53, a first gate insulative layer of the first transistor is formed on aside, distal from the first surface, of the first active layer, wherein the first gate insulative layer covers the first active layer.

Exemplarily, the gate insulative layer is formed by deposition.

In S54, a first insulative layer is formed on a side, distal from the first surface, of the first gate insulative layer, wherein the first insulative layer is provided with a first opening, wherein the first opening runs through the first insulative layer.

Exemplarily, the first opening is formed in the first insulative layer by etching.

In S55, a second active layer of a second transistor is formed in the first opening and made from the oxide semiconductor material, wherein an orthographic projection of the second active layer on the first surface is staggered from an orthographic projection of the first active layer on the first surface.

FIG. 8 is a flowchart of a method for manufacturing a display substrate according to some embodiments of the present disclosure. Referring to FIG. 8, the method includes the following steps.

In S60, a rigid base is provided.

FIGS. 9 to 23 are diagrams of processes for manufacturing a display substrate according to embodiments of the present disclosure. The processes for manufacturing the display substrate according to the present disclosure are described below with reference to FIGS. 9 to 23.

Figure 9:
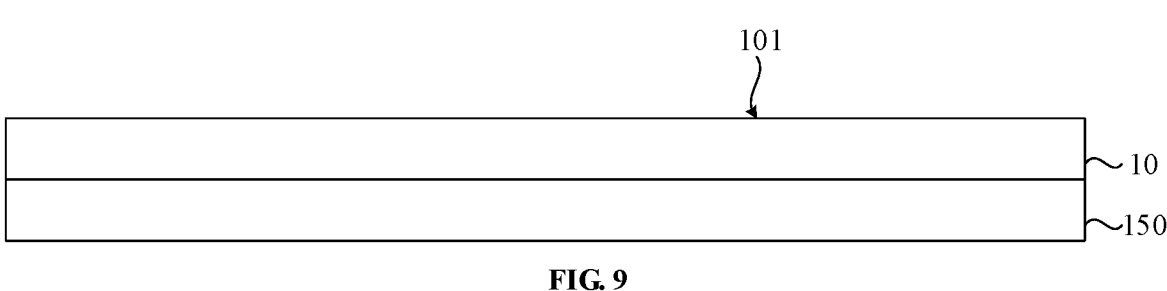
FIG. 9 is a diagram of a process for manufacturing a display substrate according to some embodiments of the present disclosure.

As illustrated in FIG. 9, a rigid base 150 is provided. The rigid base 150 provides support to subsequent film layers of the display substrate.

Exemplarily, the rigid base 150 is a glass base.

In S61, a base substrate is provided, wherein the base substrate is provided with a first surface.

In some embodiments of the present disclosure, the base substrate 10 is a flexible base, for example, a polyimide base.

As illustrated in FIG. 9, the rigid base 150 is coated with a layer of polyimide, and the polyimide is cured to form the flexible base.

In S62, a buffer layer is formed on the first surface of the base substrate.

Figure 10:
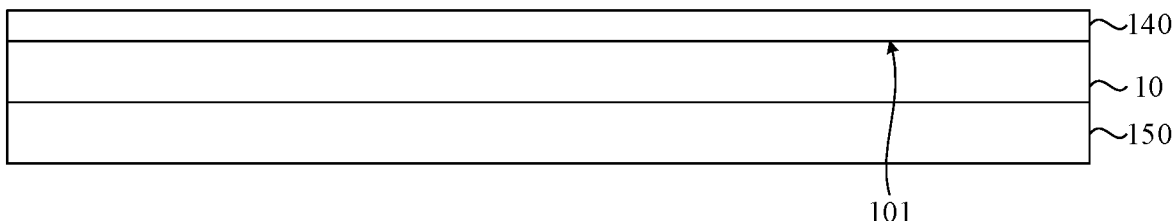
FIG. 10 is a diagram of a process for manufacturing a display substrate according to some embodiments of the present disclosure.

Referring to FIG. 10, a buffer layer 140 is formed on the base substrate 10.

Exemplarily, the buffer layer 140 is a SiOx layer, a SiNx layer or a SiOxNy layer, or a laminate of any two or three of the SiOx layer, the SiNx layer and the SiOxNy layer.

Exemplarily, the buffer layer 140 is formed on the base substrate 10 by deposition.

In S63, a first active layer of a first transistor is formed on a side, distal from the first surface, of the buffer layer.

Figure 11:
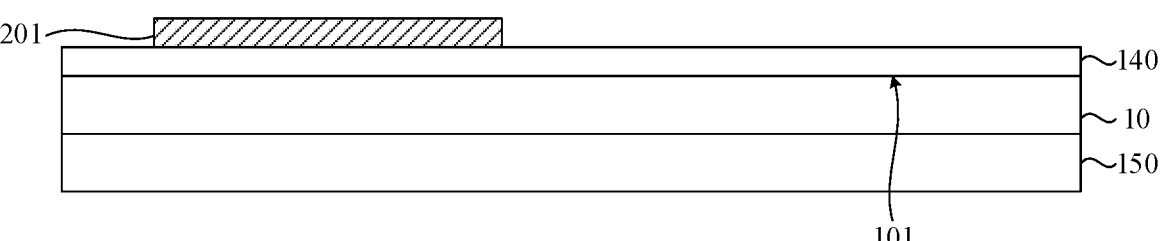
FIG. 11 is a diagram of a process for manufacturing a display substrate according to some embodiments of the present disclosure.

As illustrated in FIG. 11, a first active layer 201 is formed on the buffer layer 140.

In some embodiments of the present disclosure, the first active layer is an LTPS layer.

Exemplarily, the first active layer 201 illustrated in FIG. 11 is acquired by forming the whole LTPS layer on the buffer layer 140 by deposition, then patterning the LTPS layer, and performing high-temperature annealing treatment (activating treatment) on the LTPS layer.

In S64, a first gate insulative layer of the first transistor is formed on a side, distal from the first surface, of the first active layer.

Figure 12:
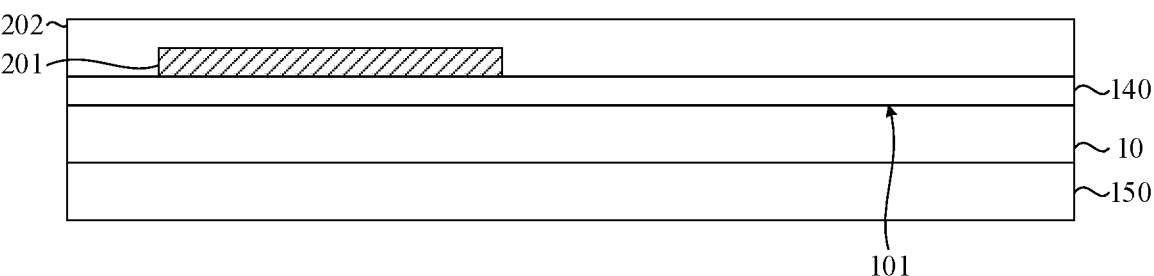
FIG. 12 is a diagram of a process for manufacturing a display substrate according to some embodiments of the present disclosure.

As illustrated in FIG. 12, a first gate insulative layer 202 is formed on and covers the first active layer 201.

In some embodiments of the present disclosure, the first gate insulative layer 202 is a silicon oxide layer.

Exemplarily, the first gate insulative layer 202 is formed on the first active layer 201 by deposition.

In some embodiments of the present disclosure, high-temperature annealing treatment is performed on the first active layer 201 upon formation of the first gate insulative layer 202. Exemplarily, high-temperature annealing is performed at the temperature of 450° C.

In S65, a first control electrode of the first transistor is formed on a side, distal from the first surface, of the first gate insulative layer.

Figure 13:
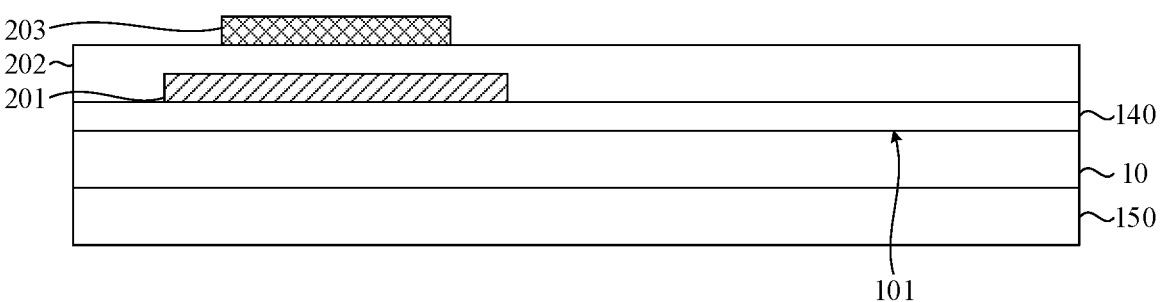
FIG. 13 is a diagram of a process for manufacturing a display substrate according to some embodiments of the present disclosure.

Referring to FIG. 13, a first control electrode 203 is formed on the first gate insulative layer 202.

In some embodiments of the present disclosure, the first control electrode 203 is made from a metal or ITO.

Exemplarily, a whole layer of a metal film or ITO film is formed on the first gate insulative layer 202 by sputtering, and the first control electrode 203 illustrated in FIG. 13 is acquired by patterning the metal film or ITO film.

In S66, a first insulative layer is formed on a side, distal from the first surface, of the first control electrode.

Figure 14:
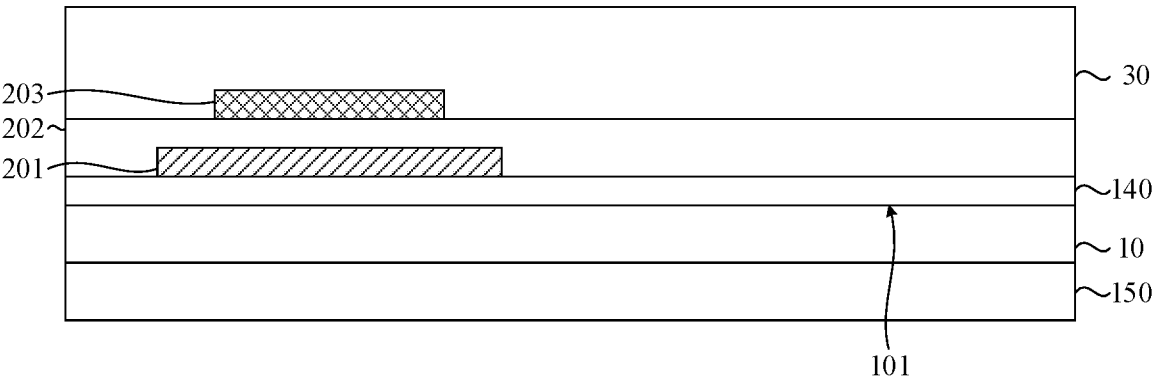
FIG. 14 is a diagram of a process for manufacturing a display substrate according to some embodiments of the present disclosure.

As illustrated in FIG. 14, a first insulative layer 30 is formed on the first control electrode 203.

In some embodiments of the present disclosure, the first insulative layer 30 includes a photosensitive polyimide layer.

Exemplarily, the first insulative layer 30 is formed on the first control electrode 203 by deposition.

In S67, a first opening is formed in the first insulative layer, wherein the first opening runs through the first insulative layer.

Figure 15:
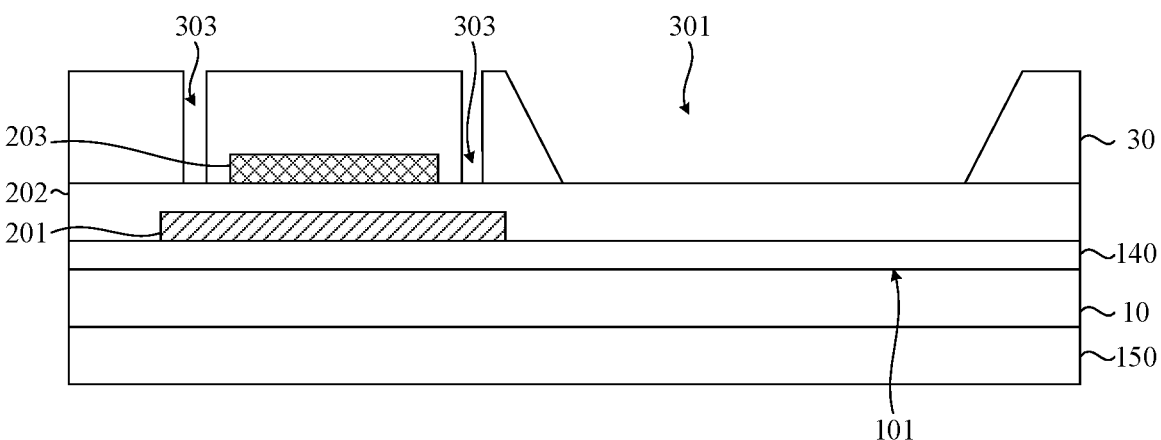
FIG. 15 is a diagram of a process for manufacturing a display substrate according to some embodiments of the present disclosure.

As illustrated in FIG. 15, a first opening 301 is formed in the first insulative layer 30.

Exemplarily, the first opening 301 is formed in the first insulative layer 30 by photoetching.

In some embodiments of the present disclosure, a third via hole 303 is formed in the first insulative layer 30 to expose the first gate insulative layer 202 while the first opening 301 is formed in the first insulative layer 30.

In S68, a second active layer, a second gate insulative layer, a second control electrode and a second insulative layer of a second transistor are sequentially formed in the first opening. The second active layer is made from an oxide semiconductor material.

Figure 16:
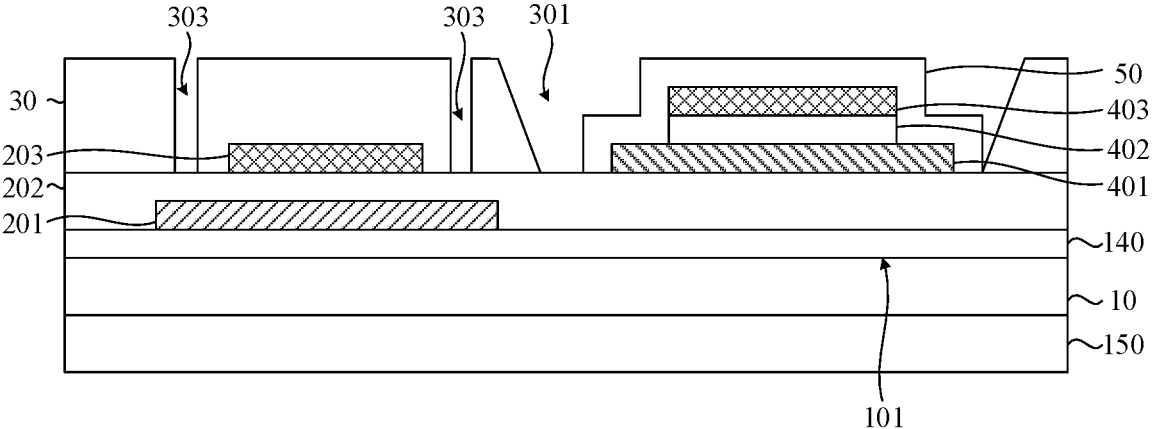
FIG. 16 is a diagram of a process for manufacturing a display substrate according to some embodiments of the present disclosure.

As illustrated in FIG. 16, the second active layer 401, the second gate insulative layer 402, the second control electrode 403 and the second insulative layer 50 are sequentially formed in the first opening 301.

In some embodiments of the present disclosure, the second active layer 401 is formed in the same way as the first active layer 201, except that the temperature of high-temperature annealing is different, and hence the specific forming method is not repeated herein.

In some embodiments of the present disclosure, the second gate insulative layer 402 is formed in the same way as the first gate insulative layer 202, the second control electrode 403 is formed in the same way as the first control electrode 203, and the second insulative layer 50 is formed in the same way as the first insulative layer 30. Therefore, the specific forming processes are not repeated herein.

In some embodiments of the present disclosure, high-temperature annealing treatment is performed on the second active layer 401 upon formation of the second insulative layer 50. Exemplarily, high-temperature annealing is performed at the temperature of 350° C.

In S69, a first electrode and a second electrode of the first transistor are formed on a side, distal from the first surface, of the first insulative layer, and are electrically connected to the first active layer through different first via holes.

Figure 17:
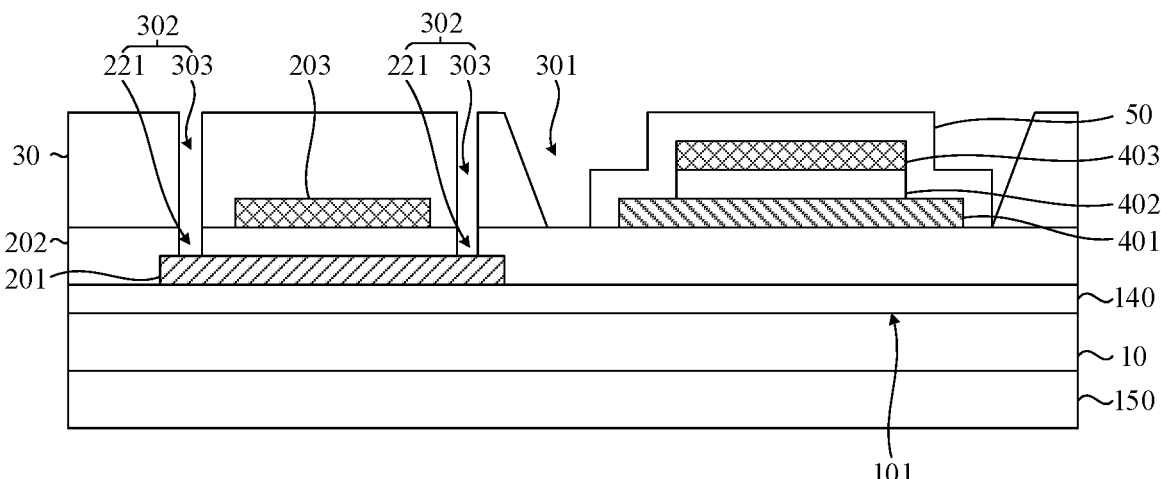
FIG. 17 is a diagram of a process for manufacturing a display substrate according to some embodiments of the present disclosure.

As illustrated in FIG. 17, a fourth via hole 221 is first formed in an exposed portion of the first gate insulative layer 202 to expose the first active layer 201, and the fourth via hole 221 is communicated with a third via hole 303 to form the first via hole 302.

Figure 18:
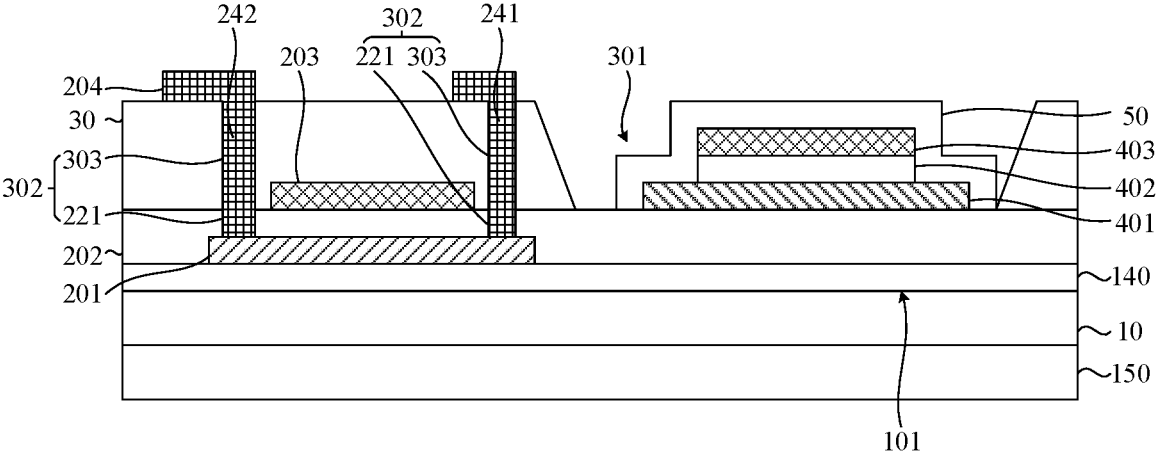
FIG. 18 is a diagram of a process for manufacturing a display substrate according to some embodiments of the present disclosure.

As illustrated in FIG. 18, a first electrode 241 and a second electrode 242 are then formed on a side, distal from the first surface 101, of the first insulative layer 30, and are electrically connected to the first active layer 201 via the different first via holes 302.

In some embodiments of the present disclosure, an oxide layer on the surface of the first active layer 201 is removed by hydrofluoric acid (HF) etching to form favorable electrical connection upon formation of the fourth via hole 221 to expose the first active layer 201. Meanwhile, since the second transistor is wrapped by the second insulative layer 50 in this process, hydrofluoric acid may not damage the second active layer 401.

In some embodiments of the present disclosure, the first electrode 241 and the second electrode 242 are made from metals, ITO, or the like.

Exemplarily, the first electrode 241 and the second electrode 242 are formed by sputtering.

In S610, a second via hole is formed in the second insulative layer.

Figure 19:
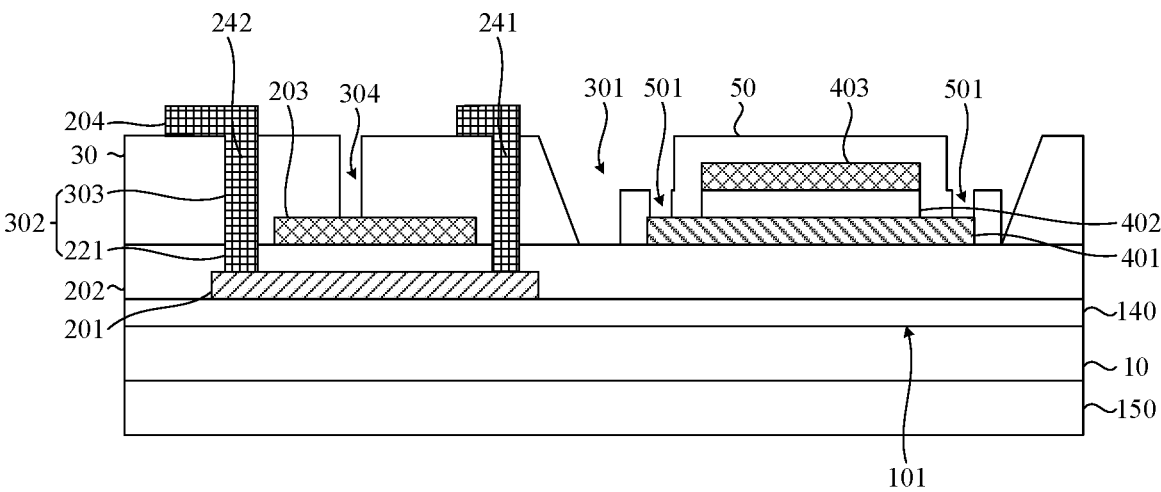
FIG. 19 is a diagram of a process for manufacturing a display substrate according to some embodiments of the present disclosure.

As illustrated in FIG. 19, a second via hole 501 is formed in the second insulative layer 50.

Exemplarily, the second via hole 501 is formed in the second insulative layer 50 by etching.

Exemplarily, a fifth via hole 304 is formed in the first insulative layer 30 to expose the first control electrode 203 while the second via hole 501 is formed in the second insulative layer 50.

In S611, a third electrode and a fourth electrode of the second transistor are formed on a side, distal from the first surface, of the second insulative layer.

Figure 20:
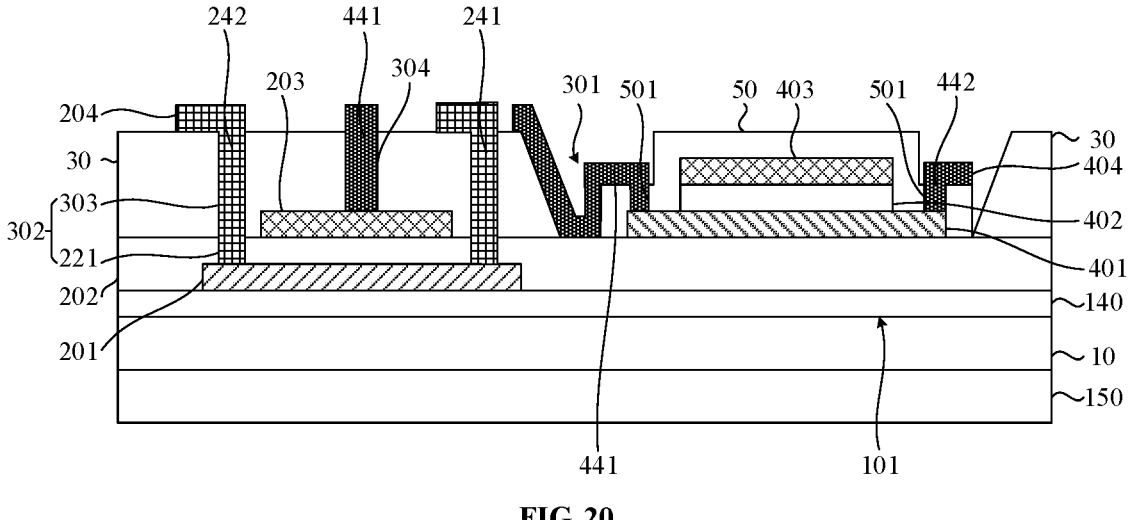
FIG. 20 is a diagram of a process for manufacturing a display substrate according to some embodiments of the present disclosure.

As illustrated in FIG. 20, a third electrode 441 and a fourth electrode 442 are formed on a side, distal from the first surface, of the second insulative layer 50. The third electrode 441 is electrically connected to the second active layer 401 through one second via hole 501, and also to the first control electrode 203 via the fifth via hole 304. The fourth electrode 442 is electrically connected to the second active layer 401 via the other second via hole 501.

In some embodiments of the present disclosure, the first electrode 241 and the second electrode 242 are disposed in the first source/drain metal layer 204, and the third electrode 441 and the fourth electrode 442 are disposed in the second source/drain metal layer 404. That is, the first source/drain metal layer 204 and the second source/drain metal layer 404 are separately formed. In other implementations, the first source/drain metal layer 204 and the second source/drain metal layer 404 are formed simultaneously. That is, the second via hole 501 is formed in the second insulative layer 50 upon formation of the first via hole 302, then, the fifth via hole 304 is formed in the first insulative layer 30, and after that, the source/drain metal layers are formed on the first insulative layer 30 and the second insulative layer 50 simultaneously. That is, the first source/drain metal layer 204 and the second source/drain metal layer 404 are formed in the same layer.

It needs to be noted that "the same layer" refers to a layer structure formed by forming, by using the same film-forming process, a film layer for the formation of a specific pattern, and then performing the one-time patterning process by using the same mask plate. According to different specific patterns, the one-time patterning process includes multiple exposing, developing or etching processes, the specific patterns in the formed layer structure are continuous or discontinuous, and these specific patterns are also at different heights or of different thicknesses.

In S612, a planarization layer is formed on sides, distal from the first surface, of the first electrode, the second electrode, the third electrode, and the fourth electrode.

Figure 21:
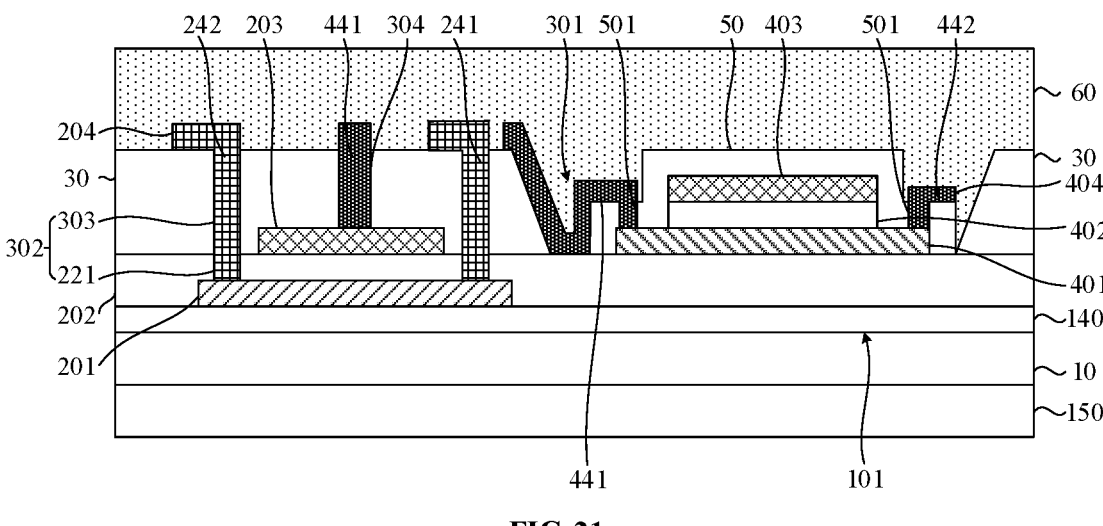
FIG. 21 is a diagram of a process for manufacturing a display substrate according to some embodiments of the present disclosure.

As illustrated in FIG. 21, a planarization layer 60 is formed on sides, distal from the first surface, of the first electrode 241, the second electrode 242, the third electrode 441 and the fourth electrode 442.

In some embodiments of the present disclosure, the planarization layer 60 is an organic layer.

Exemplarily, the planarization layer 60 is formed by deposition.

In S613, a fifth via hole is formed in the planarization layer.

Figure 22:
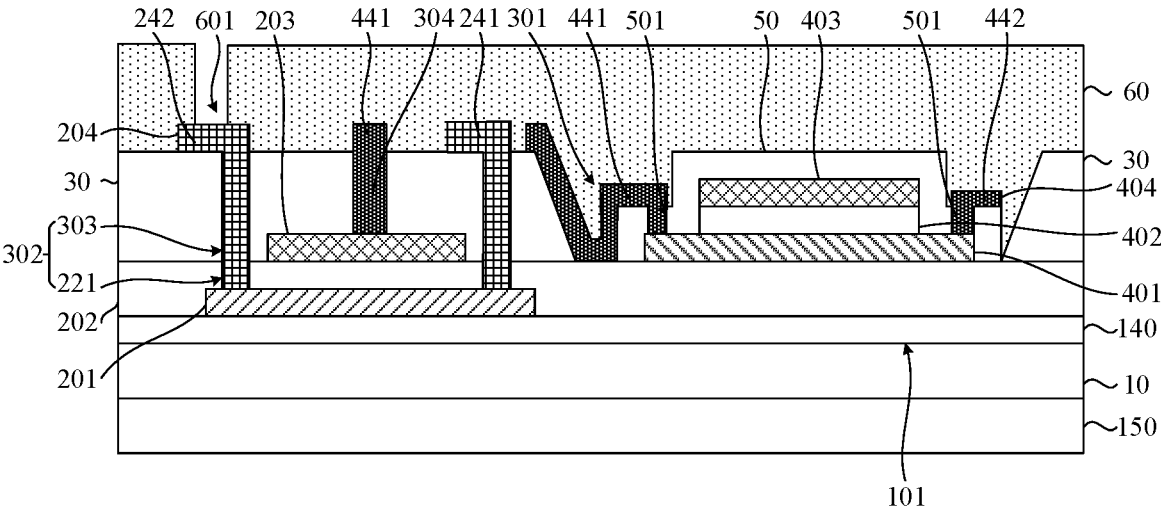
FIG. 22 is a diagram of a process for manufacturing a display substrate according to some embodiments of the present disclosure.

As illustrated in FIG. 22, a sixth via hole 601 is formed in the planarization layer 60 to expose the second electrode 242.

Exemplarily, the sixth via hole 601 is formed in the planarization layer 60 by etching.

In S614, an anode layer is formed on a side, distal from the first surface, of the planarization layer.

Figure 23:
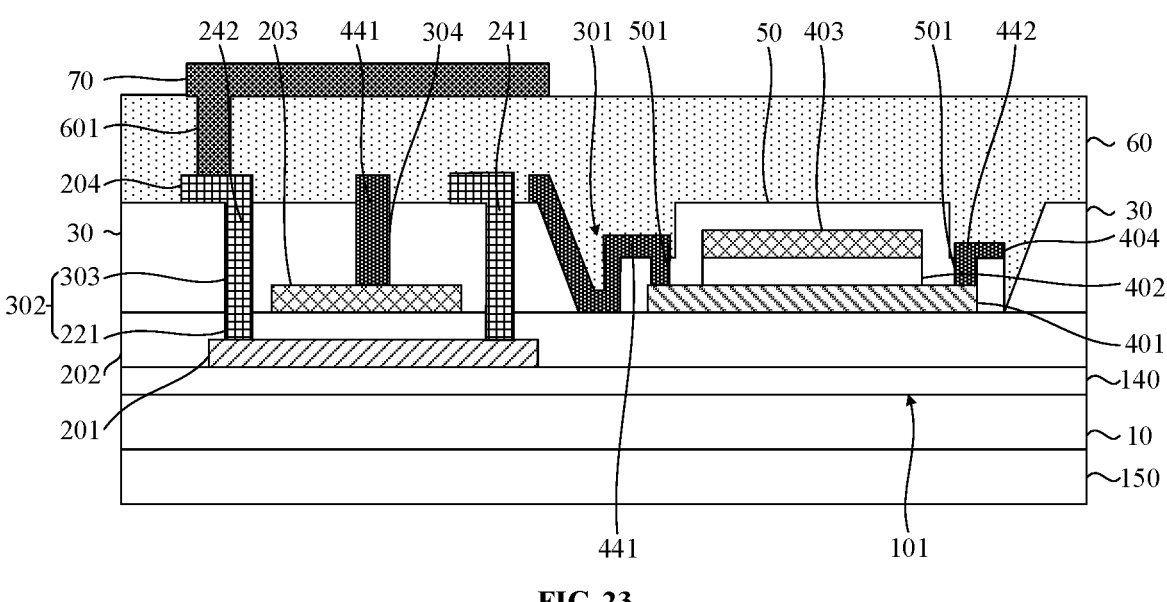
FIG. 23 is a diagram of a process for manufacturing a display substrate according to some embodiments of the present disclosure.

As illustrated in FIG. 23, an anode layer 70 is formed on a side, distal from the first surface, of the planarization layer 60, and is electrically connected to the second electrode 242 via the sixth via hole 601.

In S615, a pixel definition layer, an electroluminescence device, a photo spacer layer, and a packaging layer are sequentially formed on a side, distal from the first surface, of the anode layer.

In some embodiments of the present disclosure, the pixel definition layer 110, the electroluminescence device 100, the photo spacer layer 120 and the packaging layer 130 are sequentially formed on the anode layer 70 upon formation of the anode layer 70.

For the flexible base, the display substrate illustrated in FIG. 4 is acquired by peeling off the rigid base 150 by laser peeling upon formation of the packaging layer 130.

Some embodiments of the present disclosure further provide a display device including the display substrate described in any one of the foregoing embodiments.

In practice, the display device according to the embodiments of the present disclosure is any product or component having a display function, such as a mobile phone, a tablet computer, a television, a display, a notebook computer, a digital photo frame, a navigator, or the like.

Described above are merely optional embodiments of the present disclosure, and are not intended to limit the present disclosure. Within the spirit and principles of the present disclosure, any modifications, equivalent substitutions, improvements, and the like are within the protection scope of the present disclosure.

What is claimed is:

1. A display substrate, comprising:
a base substrate, comprising a first surface;
a first transistor, comprising a first active layer and a first gate insulative layer, the first active layer being disposed on the first surface of the base substrate, the first gate insulative layer being disposed on a side, distal from the first surface, of the first active layer and covering the first active layer;
a first insulative layer, disposed on a side, distal from the first surface, of the first gate insulative layer and provided with a first opening running through the first insulative layer; and
a second transistor, comprising a second active layer disposed in the first opening, an orthographic projection of the second active layer on the first surface being staggered from an orthographic projection of the first active layer on the first surface, the second active layer being made from an oxide semiconductor material, wherein the second active layer is disposed on the first gate insulative layer;
wherein the first transistor further comprises: a first control electrode, a first electrode, and a second electrode; wherein the first control electrode is disposed on a side, distal from the first surface, of the first gate insulative layer, the first insulative layer covers the first control electrode; and the first electrode and the second electrode run through the first insulative layer and the first gate insulative layer, and are electrically connected to the first active layer; and
the second transistor further comprises: a second gate insulative layer, a second control electrode, a second insulative layer, a third electrode, and a fourth electrode; wherein the second gate insulative layer and the second control electrode are sequentially stacked on the second active layer in a direction away from the first surface; the second insulative layer covers the second active layer, the second gate insulative layer, and the second control electrode; the third electrode and the fourth electrode run through the second insulative layer; the third electrode is electrically connected to the second active electrode and the first control electrode; and the fourth electrode is electrically connected to the second active layer;
wherein the second gate insulative layer, the second control electrode, and the second insulative layer are all disposed in the first opening.

2. The display substrate according to claim 1, wherein the first insulative layer is an organic layer, and a heat-resistant temperature of the first insulative layer is greater than 350° C.

3. The display substrate according to claim 2, wherein the first insulative layer comprises a photosensitive polyimide layer.

4. The display substrate according to claim 1, wherein a thickness of the first insulative layer in a direction perpendicular to the first surface is less than or equal to 3 μm.

5. The display substrate according to claim 1, wherein the first insulative layer and the first gate insulative layer are provided with first via holes, and the first electrode and the second electrode are electrically connected to the first active layer via the different first via holes.

6. The display substrate according to claim 1, wherein the second insulative layer wraps the second active layer, the second gate insulative layer, and the second control electrode; the second insulative layer is provided with second via holes; and the third electrode and the fourth electrode are electrically connected to the second active layer via the different second via holes.

7. The display substrate according to claim 6, further comprising:
a planarization layer disposed on a side, distal from the first surface, of the first insulative layer, and covering the first electrode, the second electrode, the third electrode, the fourth electrode, the second insulative layer and the first insulative layer; and
an anode layer disposed on a side, distal from the first surface, of the planarization layer, and electrically connected to the second electrode;
wherein an orthographic projection of the anode layer on the first surface is staggered from the orthographic projection of the second active layer on the first surface.

8. The display substrate according to claim 7, wherein the orthographic projection of the first active layer on the first surface is within the orthographic projection of the anode layer on the first surface.

9. The display substrate according to claim 1, wherein the first active layer is a low-temperature polysilicon (LTPS) layer.

10. The display substrate according to claim 1, wherein the second active layer is an indium gallium zinc oxide (IGZO) semiconductor layer.

11. The display substrate according to claim 1, wherein the base substrate is a polyimide (PI) substrate.

12. A method for manufacturing a display substrate, comprising:

providing a base substrate having a first surface;

forming a first active layer of a first transistor on a first surface of the base substrate;

forming a first gate insulative layer of the first transistor on a side, distal from the first surface, of the first active layer, the first gate insulative layer covering the first active layer;

forming a first insulative layer on a side, distal from the first surface, of the first gate insulative layer, the first insulative layer being provided with a first opening running through the first insulative layer;

forming a second active layer of a second transistor in the first opening, the second active layer being made from an oxide semiconductor material, an orthographic projection of the second active layer on the first surface being staggered from an orthographic projection of the first active layer on the first surface, wherein the second active layer is disposed on the first gate insulative layer;

wherein the first transistor further comprises: a first control electrode, a first electrode, and a second electrode; wherein the first control electrode is disposed on a side, distal from the first surface, of the first gate insulative layer, the first insulative layer covers the first control electrode; and the first electrode and the second electrode run through the first insulative layer and the first gate insulative layer, and are electrically connected to the first active layer; and the second transistor further comprises: a second gate insulative layer, a second control electrode, a second insulative layer, a third electrode, and a fourth electrode; wherein the second gate insulative layer and the second control electrode are sequentially stacked on the second active layer in a direction away from the first surface; the second insulative layer covers the second active layer, the second gate insulative layer, and the second control electrode; the third electrode and the fourth electrode run through the second insulative layer; the third electrode is electrically connected to the second active electrode and the first control electrode; and the fourth electrode is electrically connected to the second active layer;

wherein the second gate insulative layer, the second control electrode, and the second insulative layer are all disposed in the first opening.

13. The method for manufacturing the display substrate according to claim 12, further comprising:

forming a third via hole in the first insulative layer to expose the first gate insulative layer;

forming a fourth via hole in an exposed portion of the first gate insulative layer to expose the first active layer, the fourth via hole being communicated with the third via hole to form a first via hole; and forming a first electrode and a second electrode of the first transistor on a side, distal from the first surface, of the first insulative layer, the first electrode and the second electrode being electrically connected to the first active layer via different first via holes.

14. A display device, comprising a display substrate, wherein the display substrate comprises a base substrate, comprising a first surface;

a first transistor, comprising a first active layer and a first gate insulative layer, the first active layer being disposed on the first surface of the base substrate, the first gate insulative layer being disposed on a side, distal from the first surface, of the first active layer and covering the first active layer;

a first insulative layer, disposed on a side, distal from the first surface, of the first gate insulative layer and provided with a first opening running through the first insulative layer; and a second transistor, comprising a second active layer disposed in the first opening, an orthographic projection of the second active layer on the first surface being staggered from an orthographic projection of the first active layer on the first surface, the second active layer being made from an oxide semiconductor material, wherein the second active layer is disposed on the first gate insulative layer;

wherein the first transistor further comprises: a first control electrode, a first electrode, and a second electrode; wherein the first control electrode is disposed on a side, distal from the first surface, of the first gate insulative layer, the first insulative layer covers the first control electrode; and the first electrode and the second electrode run through the first insulative layer and the first gate insulative layer, and are electrically connected to the first active layer; and the second transistor further comprises: a second gate insulative layer, a second control electrode, a second insulative layer, a third electrode, and a fourth electrode; wherein the second gate insulative layer and the second control electrode are sequentially stacked on the second active layer in a direction away from the first surface; the second insulative layer covers the second active layer, the second gate insulative layer, and the second control electrode; the third electrode and the fourth electrode run through the second insulative layer; the third electrode is electrically connected to the second active electrode and the first control electrode; and the fourth electrode is electrically connected to the second active layer;

wherein the second gate insulative layer, the second control electrode, and the second insulative layer are all disposed in the first opening.

15. The display device according to claim 14, wherein the first insulative layer is an organic layer, and a heat-resistant temperature of the first insulative layer is greater than 350° C.

16. The display device according to claim 15, wherein the first insulative layer comprises a photosensitive polyimide layer.

17. The display device according to claim 14, wherein a thickness of the first insulative layer in a direction perpendicular to the first surface is less than or equal to 3 μm.

18. The display device according to claim 14, wherein the second active layer is an indium gallium zinc oxide (IGZO) semiconductor layer.

\* \* \* \* \*